United States Patent [19]

Higashino et al.

[11] Patent Number: 5,047,390
[45] Date of Patent: Sep. 10, 1991

[54] JOSEPHSON DEVICES AND PROCESS FOR MANUFACTURING THE SAME

[75] Inventors: Hidetaka Higashino, Matsubara; Koichi Mizuno, Nara; Hideaki Adachi, Neyagawa; Kentaro Setsune, Sakai; Akira Enokihara, Nara; Shinichiro Hatta, Hirakata; Kiyotaka Wasa, Nara; Shigemi Kohiki, Osaka; Tomoaki Matsushima, Soraku, all of Japan

[73] Assignee: Matsushita Electric Industrial Co., Ltd., Osaka, Japan

[21] Appl. No.: 413,174

[22] Filed: Sep. 27, 1989

[30] Foreign Application Priority Data

| Oct. 3, 1988 | [JP] | Japan | 63-249206 |
| Nov. 17, 1988 | [JP] | Japan | 63-291219 |
| Nov. 21, 1988 | [JP] | Japan | 63-293859 |
| Jan. 12, 1989 | [JP] | Japan | 1-005208 |
| Jan. 31, 1989 | [JP] | Japan | 1-021402 |
| Mar. 10, 1989 | [JP] | Japan | 1-058324 |

[51] Int. Cl.$^5$ .................. H01B 12/00; H01L 39/12; H01L 39/22; B05D 5/12
[52] U.S. Cl. ........................ 505/1; 505/702; 505/873; 505/874; 357/5; 427/62
[58] Field of Search .............. 357/5; 427/62; 505/702, 505/873, 874, 1

[56] References Cited

U.S. PATENT DOCUMENTS 4,499,119  2/1985  Smith ........................ 357/5

FOREIGN PATENT DOCUMENTS

| 0342038 | 11/1989 | European Pat. Off. | |
| 58-2082 | 1/1983 | Japan | 505/874 |
| 58-77265 | 5/1983 | Japan | 357/5 |
| 58-128780 | 8/1983 | Japan | 505/874 |
| 61-220385 | 9/1986 | Japan | 357/5 |
| 63-224273 | 9/1988 | Japan | 357/5 |

OTHER PUBLICATIONS

"Y-Ba-Cu-O/Nb Tunnel TGype Josephson Junctions", Inoue et al., Jap. J. of Appl. Phys, vol. 26, #9, Sep. 1987, pp. L1443-L1444.
"A New High-Tc Oxide Supeconductor Without a Rare Earth Element", Maeda et al, Jpn. J. of Appl. Phys., vol. 27, #2, Feb. 1988, pp. L209-L210.
"A Transmission Electron Microscope and Group Theoretical Study of the New Bi-Based High-Tc Superconductors and Some Closely Related Aurivillius Phases", Withers et al, Phy C; Solid State Phys, vol. 21, 1988, pp. 6067-6083.
Journal of Physics D, vol. 20, No. 10, Oct. 1987, pp. 1330-1335, London, GB; M. G. Blamire et al: "Fabrication and Properties of Supconducting Device Structures in YBa2Cu3O7-x Thin Films".
IEEE Transactions of Magnetics, vol. 25, No. 2, Mar. 1989, pp. 1298-1300, N.Y., U.S., & Applied Superconductivity Conference, San Francisco, Aug. 21, '88; D. B. Schwartz: "The Observation of the AC Josephson in a YBa2Cu3O7/Au/YBa2Cu3O7 Junction", p. 1298, paragraph 3.
J. G. Bednorz and K. A. Muller, Zeitschrift fur Physik B- Condensed Matter, 64, 189-193 (1986).
Z. Z. Sheng and A. M. Hermann, Nature, 332, 138-139 (1988).

Primary Examiner—Rolf Hille
Assistant Examiner—Mahshid Saadat
Attorney, Agent, or Firm—Stevens, Davis, Miller & Mosher

[57] ABSTRACT

A Josephson device, comprising a junction formed by forming the first layer-shaped oxide superconductor thin film including a plurality of Cu-O layers on a substrate, a barrier layer thereon and the second layer-shaped oxide superconductor thin film on the barrier layer. The Josephson device according to the present invention is manufactured by forming the first layer-shaped oxide superconductor thin film on a substrate, forming a barrier layer in the same vacuum chamber, defining patterns to said barrier layer and said first layer-shaped oxide superconductor thin film, forming an interlayer insulating film on said barrier layer, removing said interlayer insulating film in a region serving as a junction, effecting exposure to oxygen plasma, forming the second layer-shaped oxide superconductor thin film in contact with a part of the surface of said barrier layer and defining patterns to said second layer-shaped oxide superconductor thin film.

4 Claims, 10 Drawing Sheets

JOSEPHSON DEVICES AND PROCESS FOR MANUFACTURING THE SAME

The present invention relates to tunnel junction type Josephson devices using an oxide superconductor and a process for manufacturing the same.

Conventionally, although niobium nitride (NbN), germanium niobium (Nb$_3$Ge) and the like, which are A15 type binary compounds have been known as a superconductor, the superconducting transition temperature of these materials are 24K at best, whereas an oxide superconductor as a perovskite type ternary compound is expected to have a higher transition temperature and a Ba-La-Cu-O type high temperature superconductor is proposed [J. G. Bednorz and K. A. Müller, Zeitschrift für Physik B - Condensed Matter, 64, 189-193 (1986)]. Further, some of oxide superconductors discovered recently have a superconducting transition temperature exceeding the temperature of liquid nitrogen (77.3K), and thus this discovery is considered to enlarge the fields to which superconductors are applied. In particular, it is also discovered that a Bi-Sr-Ca-Cu-O type superconductor composed of a Bi type layer-shaped oxide exhibits a superconducting transition temperature equal to or higher than 100K. [H. Maeda, Y. Tanaka, M. Fukutomi and T. Asano, Japanese Journal of Applied Physics, 27, L209-L210 (1988)]. Recently, it is reported that a Tl-Ba-Ca-Cu-O type material exhibits a superconducting transition at 120K or more and it is found that this is a layer-shaped oxide like a Bi type layer-shaped oxide [Z. Z. Sheng and A. M. Hermann, Nature, 332, 138-139 (1988)]. Although the superconducting mechanism of this kind of materials is not known in detail, there is a possibility that a transition temperature thereof exceeds a room temperature. Then, they are expected to have more hopeful characteristics as a superconductor than conventional binary compounds.

A Josephson device having a Josephson junction using a superconductor is known as a typical superconductive device. Josephson junctions include a tunnel junction type composed of superconductors disposed on opposite sides of a very thin insulating layer having a thickness of several tens of angstrom, a bridge type composed of a single superconductor having a thin part contracted to the size of 1 μm, a point contact type using a sharp stylus composed of a superconductor and the like. The Josephson devices of the above types except the tunnel junction type require a super-fine pattern lithography technology with a result of low reproducibility and yield, and thus it is very difficult to integrate many Josephson devices. Therefore, they are mainly manufactured using the conventional superconductor such as a binary compound.

On the other hand, with respect to a Josephson device using the above oxide superconductor, the following prototypes have been conventionally manufactured: a broken type Josephson device composed of an oxide superconductor which is divided into two parts and has a slight contact made therebetween; a bride type Josephson device composed of a thin film of an oxide superconductor having a small construction; and a proximity effect bridge type Josephson device composed of oxide superconductors coupled a noble metal such as Au, Ag or the like. In addition, a tunnel type Josephson device is manufactured as a prototype which is composed of an oxide superconductor such as Y-Ba-Cu-O, Bi-Sr-Ca-Cu-O, Tl-Ba-Ca-Cu-O or the like and a metal superconductor such as Nb, Pb or the like.

It has been difficult, however, to manufacture a tunnel type Josephson device composed only of oxide superconductors, because it is considered that an interface reaction arises between a barrier layer and an oxide superconductor thin film when the barrier layer or a second oxide superconductor thin film is formed and thus the structure of the first or second thin film composed of the oxide superconductor is broken and the characteristics thereof are deteriorated.

An object of the present invention is to provide a superconductive tunnel junction type Josephson device of good reproducibility provided with an excellent junction.

The present invention relates to a Josephson device comprising a junction formed by forming the first layer-shaped oxide superconductor thin film including a plurality of Cu-O layers on a substrate, a barrier layer thereon and the second layer-shaped oxide superconductor thin film on the barrier layer. Further, the present invention relates to a process for manufacturing a Josephson device comprising forming on a substrate the first layer-shaped oxide superconductor thin film including a plurality of Cu-O layers and a barrier layer in the same vacuum chamber; defining patterns to said barrier layer and said first layer-shaped oxide superconductor thin film; forming an interlayer insulating film on said barrier layer; removing said interlayer insulating film in a region serving as a junction; effecting exposure to oxygen plasma; forming the second layer-shaped oxide superconductor thin film in contact with a part of the surface of said barrier layer and defining patterns to said second layer-shaped oxide superconductor thin film.

Figure 1:
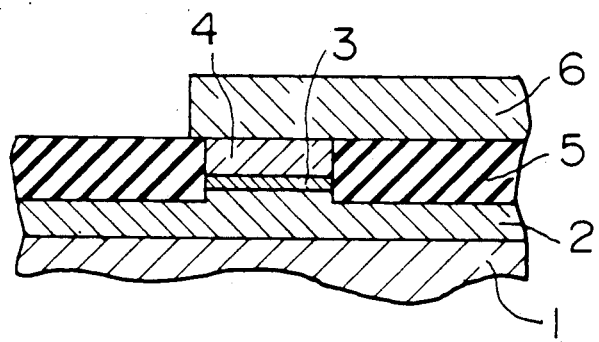
FIG. 1 is a cross sectional view illustrating an embodiment of Josephson device according to the present invention.
Figure 2A:
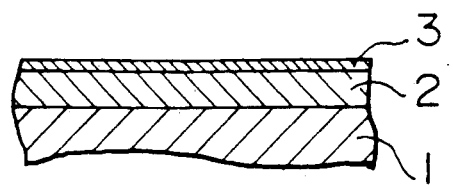
FIGS. 2a-2f are process cross sectional views illustrating an embodiment of a process for manufacturing the Josephson device of FIG. 1 according to the present invention.
Figure 2B:
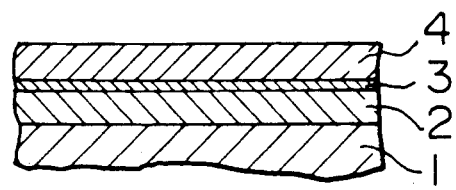
Figure 2C:
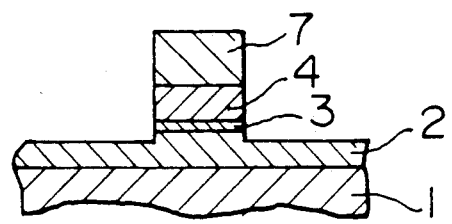
Figure 2D:
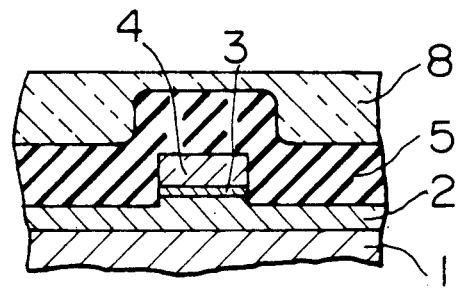
Figure 2E:
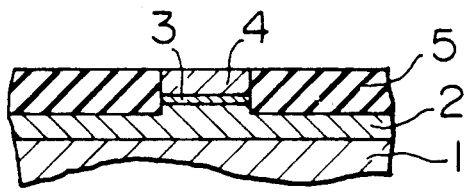
Figure 2F:
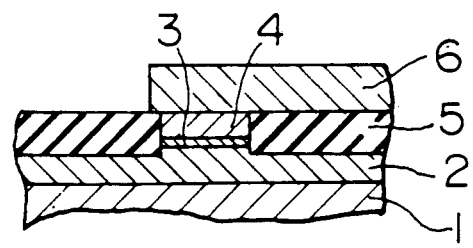
Figure 3A:
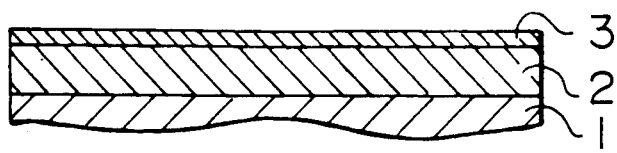
FIGS. 3a-3f are process diagrams of an embodiment of a process for manufacturing a Josephson device according to the present invention.
Figure 3B:
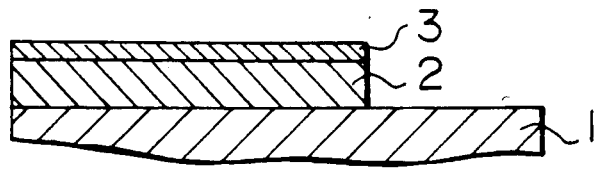
Figure 3C:
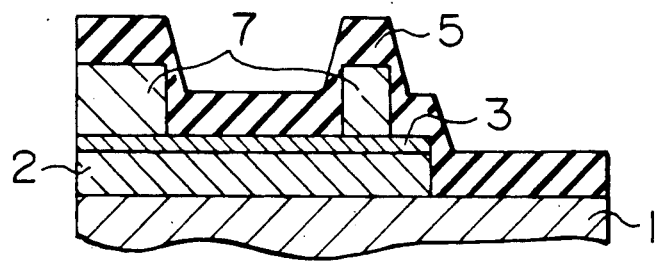
Figure 3D:
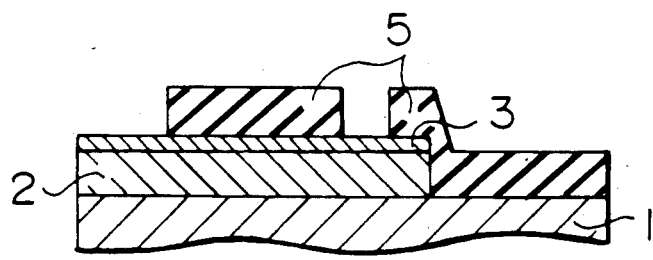
Figure 3E:
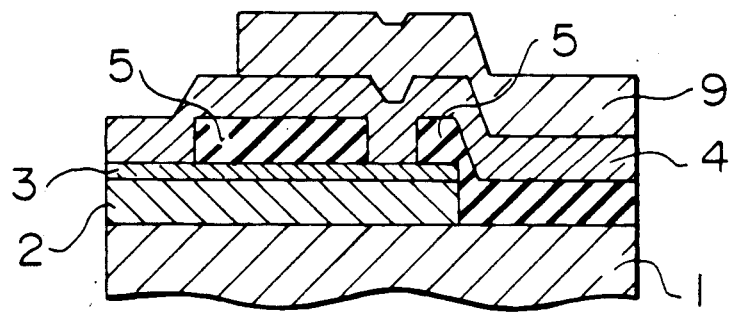
Figure 3F:
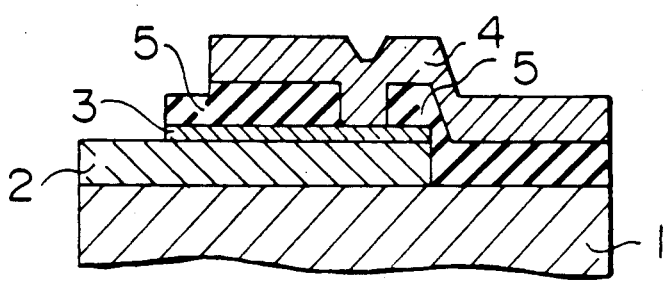

As shown in FIG. 1, the first layer-shaped oxide superconductor thin film 2 is formed on a substrate 1, a barrier layer 3 is formed on the thin film 2 and the second layer-shaped oxide superconductor thin film 4 is formed to provide a junction. An interlayer insulating film 5 is formed in such a manner that it surrounds the junction. A layer-shaped oxide superconductor thin film 6 for a contact is formed on the interlayer insulating film 5 so that the thin film 6 is brought into contact with the second layer-shaped oxide superconductor thin film 4. A Josephson device according to the present invention is manufactured.

Next, a process for manufacturing the Josephson device of FIG. 1 will be described with reference to FIG. 2. For example, MgO substrate is used as the substrate 1, the Bi type layer-shaped oxide superconductor thin film 2 mainly composed of $Bi_2Sr_2Ca_1Cu_2O_y$ is formed to a thickness of 300 nm at a substrate temperature of about 700° C. by an rf magnetron sputtering method, and the barrier layer 3 is formed to a thickness of 20 nm in the same vacuum [FIG. 2a]. A material familiar with the layer-shaped oxide superconductor thin film 2 is used as the barrier layer 3, and an oxide is preferably used. A material of the barrier layer 3 must be carefully selected since problems arise in that when the substrate 1 is heated to further form the layer-shaped oxide superconductor thin films 4 and 6, the barrier layer 3 is diffused and deteriorates the layer-shaped oxide superconductor thin film 2 or 4 and the like, or the barrier layer 3 is broken to cause the layer-shaped oxide superconductor thin films 2 and 4 to be short-circuited.

For example as a material of the barrier layer, there is used alone or in admixture, bismuth oxide, strontium oxide, calcium oxide, barium oxide, zinc oxide, magnesium oxide, and zirconium oxide and the like. These materials do not cause a mutual diffusion, and even if the mutual diffusion is caused, they are less deteriorated since they are composed of a material similar to the Bi type layer-shaped oxide superconductor thin film. In addition, a Bi oxide type layer-shaped compound can be used as a material of the barrier layer 3. It is found that when a Bi oxide type layer-shaped compound containing at least one selected from the group consisting of Ti, Nb, Ta and W is used as a material of the barrier layer 3, a tunnel junction with a less current leakage can be also provided likewise. Further, an excellent tunnel junction can be formed likewise when a material of the barrier layer 3 is composed of a Bi oxide type layer-shaped compound containing at least one selected from the group consisting of Ti, Nb and Ta and at least one selected from the group consisting of Pb, Ca, Sr and Ba; a Bi oxide type layer-shaped compound containing Ti and at least one selected from the group consisting of Na, K, Fe, Nb and Ta; or a Bi oxide type layer-shaped compound containing Nb and K. Furthermore, when $Bi_2Ti_4O_{11}$ or $Bi_4Ti_3O_{12}$ is used as a material of the barrier layer 3, an excellent tunnel junction can be formed. Thereafter, the second layer-shaped oxide superconductor thin film 4 is further formed to a thickness of about 400 nm in the same vacuum by an rf magnetron spattering method [FIG. 2b]. A temperature of the substrate is about 700° C. A resist pattern 7 is formed to a thickness of about 1 μm on the thin films continuously formed as described above by a photolithographic process, and etching is effected thereto by an Ar ion milling to expose the first layer-shaped oxide superconductor thin film 2 [FIG. 2c]. Next, the resist 7 is removed by irradiation of $O_2$ plasma or the like and then the interlayer insulating film 5 is formed. A material similar to one used for the barrier layer 3 can be used. Thereafter, a spin-on-glass 8 is applied on the interlayer insulating layer by a spinner and baked to be flown so that the surface thereof is made flat [FIG. 2d]. Then, the surface thereof is etched with Ar ion [FIG. 2e]. The surface of the first layer-shaped oxide superconductor thin film 4 is exposed in this step. Further, the layer-shaped oxide superconductor thin film 6 for a contact is formed on the first layer-shaped oxide superconductor thin film 4 and the layer-shaped oxide superconductor thin film for a contact 6 is patterned by photolithography and etching, whereby a Josephson device is manufactured.

FIG. 3 shows process diagrams of an embodiment of a process for manufacturing a Josephson device according to the present invention. The first layer-shaped oxide superconductor thin film 2 (film thickness: 300 nm) of Bi-Sr-Ca-Cu-O type is formed on a substrate 1 making use of a (100) surface of MgO at a substrate temperature of about 700° C. by an rf magnetron spattering method and then $Bi_4Ti_3O_{12}$ is deposited as a barrier layer 3 (film thickness: 2 nm) by an rf magnetron sputtering method while the vacuum is maintained [FIG. 3a]. Then, the first layer-shaped oxide superconductor thin film 2 is patterned by photolithography and Ar ion milling [FIG. 3b].

Next, a negative type resist is spin-coated to a thickness of 8.0 nm as a protective layer and a positive type resist is spin-coated thereon to a thickness of 800 nm, and then they are exposed and developed to define a pattern of a resist 7 which is formed only in a region serving as a junction and a contact portion of the first layer-shaped oxide superconductor thin film 2. $Bi_4Ti_3O_{12}$ is deposited thereon to a thickness of 300 nm by an rf magnetron spattering method to form an interlayer insulating film 5 [FIG. 3c]. The specimen was immersed in acetone and slightly subjected to ultrasonic waves for lifting off [FIG. 3d]. The remaining resist is removed by ashing in oxygen plasma and the barrier layer 3 is cleaned. Immediately after that, the second oxide superconductor thin film 4 is formed in the same vacuum at a substrate temperature of 700° C. by an rf magnetron spattering method. A film thickness thereof is 300 nm. A resist pattern 9 is formed thereon to pattern the second oxide superconductor thin film 4 by ordinary photolithography [FIG. 3e]. Etching is effected by an Ar ion milling so that the second oxide superconductor thin film 4 is patterned and simultaneously a window is defined to the barrier layer 3 for a contact with the first oxide superconductor thin film 2. The remaining resist pattern 9 is removed by ashing in oxygen plasma and then a Josephson device is formed by being heated at 845° C. in an oxygen atmosphere for four hours and annealed by being cooled in a furnace to a room temperature [FIG. 3f]. The Josephson device manufactured as described above corresponds to a structure wherein the second layer-shaped oxide superconductor thin film 4 and the layer-shaped oxide superconductor thin film for a contact 6 are composed of the same material and united in FIG. 1.

Figure 4:
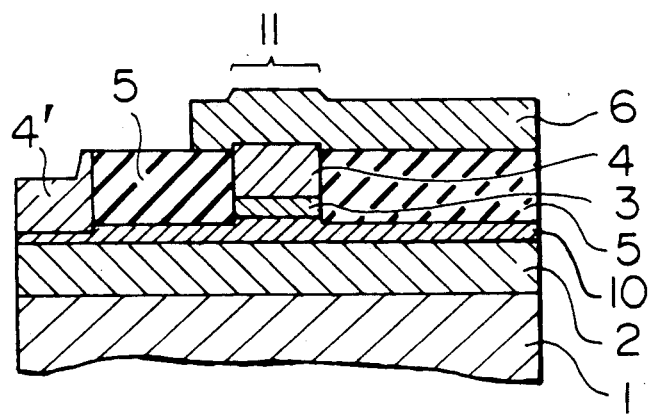
FIG. 4 is a cross sectional view illustrating an embodiment of Josephson device according to the present invention.
Figure 5A:
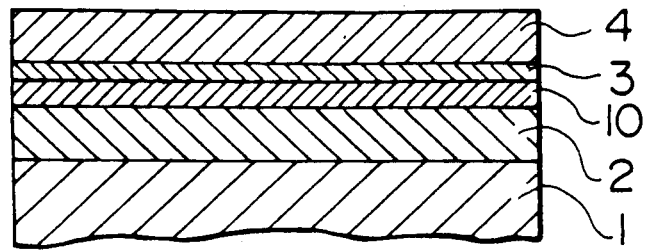
FIG. 5 are process cross sectional views illustrating an embodiment of process for manufacturing the Josephson device of FIG. 4 according to the present invention.
Figure 5B:
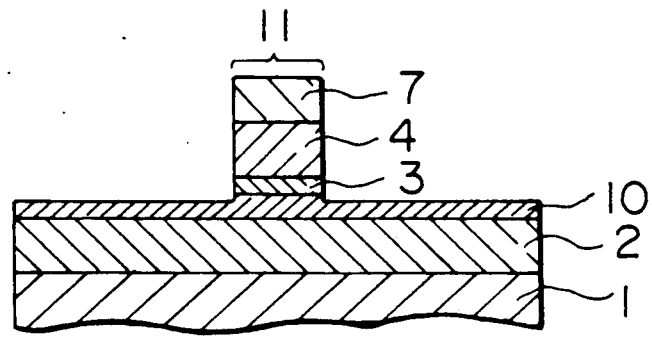
Figure 5C:
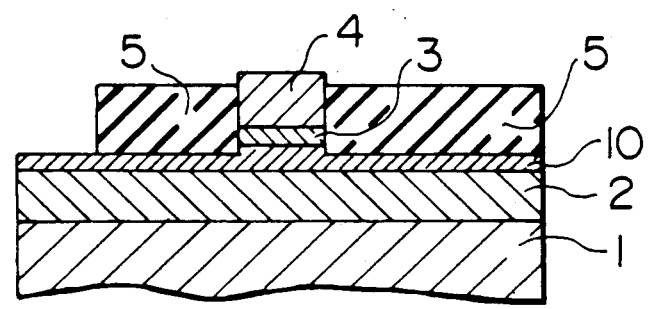
Figure 5D:
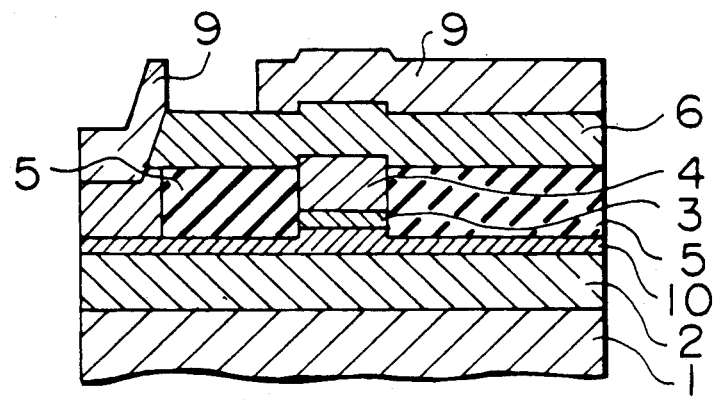
Figure 5E:
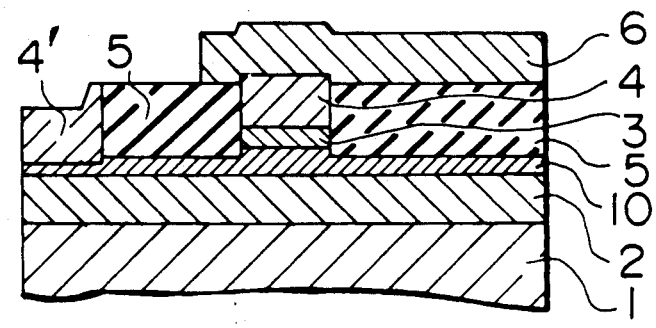

FIG. 4 shows a cross sectional view of an embodiment of Josephson device according to the present invention. FIG. 5 shows an embodiment of process for manufacturing it.

In FIG. 4, the first layer-shaped oxide superconductor thin film 2 is formed on a substrate 1, a thin metal film 10 is formed thereon and a barrier layer 3 and then the second layer-shaped oxide superconductor thin film 4 are further formed thereon to form a Josephson junction 11 which is surrounded by an interlayer insulating film 5. The lower portion of the interlayer insulating film 5 is in contact with the surface of the thin metal film 10, and a part of the upper surface thereof is in contact with a layer-shaped oxide superconductor thin film 6 for wiring. Further, the layer-shaped oxide superconductor thin film 6 for wiring is in contact with the second layer-shaped oxide superconductor thin film 4 at a part of the lower surface thereof to form a superconductive contact and serves as an upper electrode of a Josephson junction. In addition, a layer-shaped oxide superconductor thin film 4' for a contact directly formed on the thin metal film 10 forms a super-conductive contact with the first layer-shaped oxide superconductor thin film 2 through the thin metal film 10 due to a proximity effect and serves as a lead electrode of a lower electrode of the junction.

Next, a process for manufacturing the Josephson device of FIG. 4 is described with reference to FIG. 5. The first layer-shaped oxide superconductor thin film 2 (film thickness: 300 nm) of Bi-Sr-Ca-Cu-O type is formed on a substrate 1 using a MgO (100) surface at a substrate temperature of 700° C. by an rf magnetron spattering method. As a target there is used a composition of Bi:Sr:Ca:Cu=1.6:1:1.5:2 and a spattering is effected in a mixed atmosphere of Ar and $O_2$ at 0.5 Pa. Thereafter, a thin metal film 10 composed of Au (film thickness: 10 nm) is formed thereon by a resistance heating method without breaking a vacuum and a barrier layer 3 composed of Bi (film thickness: 2 nm) and acting as a tunnel barrier is formed thereon by an rf magnetron spattering method. As materials of the thin metal film 10, there are also used, alone or in admixture, Ag, Au, Pt, Pd and the like. A substrate temperature is preferably 400° C. at this time. Thereafter, the second layer-shaped oxide superconductor thin film 4 composed of Bi-Sr-Ca-Cu-O is formed to a thickness of 300 nm without breaking the vacuum [FIG. 5a]. The second layer-shaped oxide superconductor thin film 4 and the barrier layer 3 are patterned by a photolithographic process and Ar ion milling to form a junction 11 [FIG. 5b]. A resist 7 is preferably composed of a negative type spin-coated to a thickness of 80 nm and a positive type spin-coated thereon to a thickness of 800 nm as a protective layer. It is convenient that etching is effected until the surface of the thin metal film 10 is exposed. An accelerating voltage of Ar ion is preferably about 500 V. Next, $Bi_2O_3$ is deposited to a thickness of 300 nm at room temperature by an rf magnetron spattering method to form an interlayer insulating film 5. It is immersed in acetone and slightly subjected to ultrasonic waves for lifting off. The remaining resist is removed by ashing in oxygen plasma, and the second layer-shaped oxide superconductor thin film 4 and the contact portion of the thin metal film 10 are cleaned [FIG. 5c]. Next, layer-shaped oxide superconductor thin film 6 of Bi-Sr-Ca-Cu-O type for wiring is formed at a temperature of 700° C. A thickness thereof is 300 nm. Further, a photoresist 9 is spin-coated thereon to a thickness 800 nm, exposed and developed, and thus a pattern is formed for wiring and for a superconductive contact of the first and second layer-shaped oxide superconductor thin films 2 and 4 [FIG. 5d]. The resist at this time can be either a negative type or a positive type. Next, a layer-shaped oxide superconductor thin film 6 for wiring is etched by an Ar ion milling. Thereafter, the remaining resist 9 is removed by ashing in oxygen plasma. This is annealed in an oxygen atmosphere to form a Josephson device. The contamination of interfaces can be prevented by forming the first layer-shaped oxide superconductor thin film 2, the thin metal film 10, the barrier layer 3 and the second layer-shaped oxide superconductor thin film 4 sequentially without breaking the vacuum. In addition, it is also considered that the thin metal film 10 serves as a buffer layer against a mutual diffusion between the barrier layer 3 and the first layer-shaped oxide superconductor thin film 2 so that a degree of freedom for selecting a material of the barrier layer 3 is increased. To provide an outstanding effect as the buffer layer, it is preferable to use a metal containing at least one selected from the group consisting of Ag, Au, Pt and Pd as the material of the thin metal film 10. Further, it is observed that the exposure to the oxygen plasma after the process of FIG. 5c tends to enable the superconducting characteristics of the second layer-shaped oxide superconductor thin film 4 to be restored or improved. Furthermore, it is observed that a critical temperature of the junction between the first layer-shaped oxide superconductor thin film 2 and the second layer-shaped oxide superconductor thin film 4 before annealing is effected in the process of FIG. 5e tends to rise after the annealing. A Y-Ba-Cu-O type, Bi-Pb-Sr-Ca-Cu-O type, Tl-Ba-Ca-Cu-O type, Tl-Pb-Sr-Ca-Cu-O type and the like are used as layer-shaped oxide superconductor of the above embodiments in addition to the Bi-Sr-Ca-Cu-O type.

Figure 6:
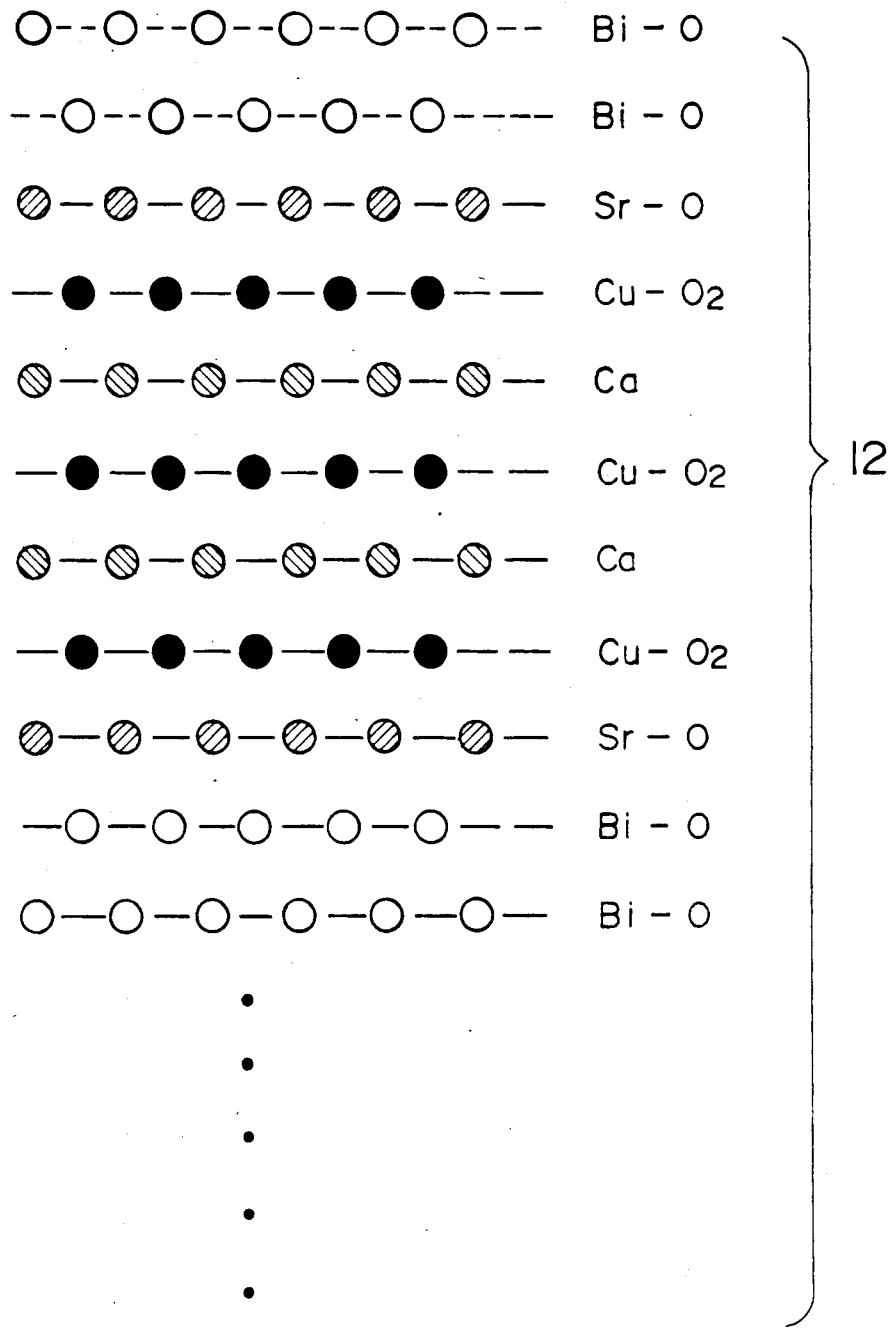
FIG. 6 is a schematic diagram of a crystal structure of a layer-shaped oxide superconductor thin film including Cu-O layers.

These materials are characterized in that they are crystals including Cu-O layers. FIG. 6 schematically shows, as an example, a layer-shaped crystal structure of $Bi_2Sr_2Ca_2Cu_3O_y$. Numeral 12 designates the first layer-shaped oxide superconductor thin film, and FIG. 6 shows a substrate crystal unit portion of this thin film 12. Although this Cu-O layer is considered to make some contribution to superconductivity, this view does not yet come to conclusion at present. An embodiment of layer-shaped oxide superconductor thin film of Bi-Sr-Ca-Cu-O type will be described below in detail as an example.

Respective simple substances or compounds constituting these superconductors are evaporated as evaporating sources and periodically deposited on a substrate in a gas containing oxygen at a substrate temperature of 400°-900° C. It is found that when an evaporating rate from each evaporating source is regulated in this vapor deposition, a phase having a critical temperature of at least 100K appears corresponding to a deposition cycle. The inventors have discovered that when a substrate temperature is, in particular, in a range of 500°-900° C., a phase having excellent crystallinity and a critical temperature of at least 100K can be formed. The thin film formed exhibits a superconducting transition of about 80K in the state as it is. Here, the superconducting thin film is manufactured at about 650° C. or less to prevent diffusion occurring through a tunnel barrier layer at a Josephson junction. The first layer-shaped oxide superconductor thin film is formed as described above.

There are several methods for periodically depositing the respective simple substances or compounds constituting the superconductor. In general, the periodically laminated layers can be formed in such a manner that a shutter is opened and closed in front of the evaporating sources when an MBE apparatus or multi-source EB vapor deposition apparatus is used or a type of gas is changed when a vapor phase epitaxy is used. An excellent laminated films also can be formed by a spattering method using a plasma discharge or laser beam. In this case, it is considered that a high oxygen gas pressure, spattering discharge or the like in the spattering is convenient for the formation of a phase composed of the Bi type layer-shaped composite oxide and having a critical temperature of at least 100K.

In addition, the Bi layer-shaped composite oxide preferably contains Pb.

Figure 7A:
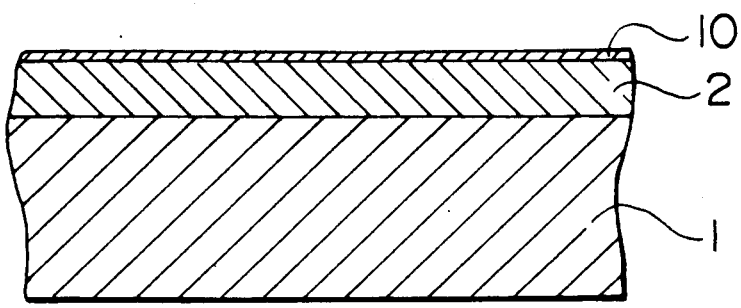
FIG. 7 is process cross sectional views illustrating an embodiment of process for manufacturing a Josephson device according to the present invention.
Figure 7B:
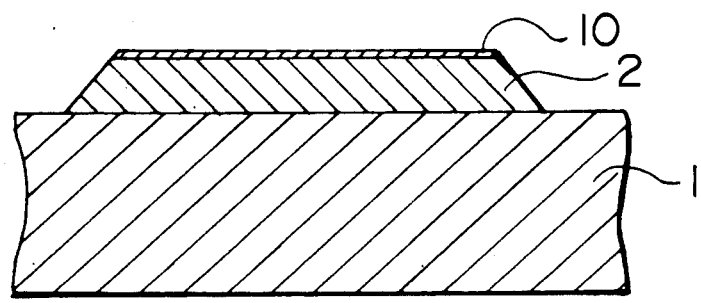
Figure 7C:
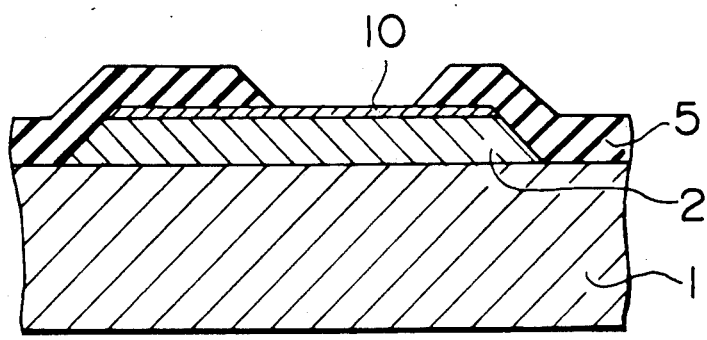
Figure 7D:
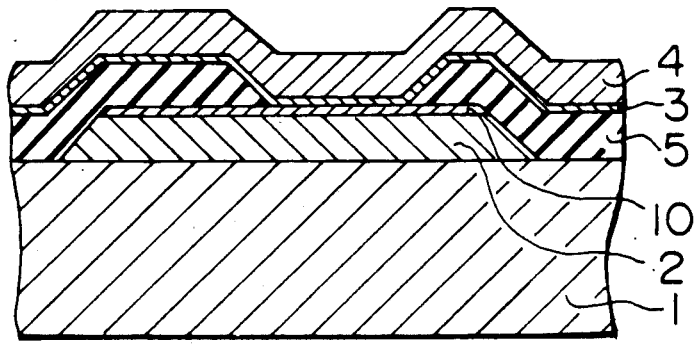

As shown in FIG. 7a, the formation of the first layer-shaped oxide superconductor thin film 2 on a substrate 1 by the method described above makes it easy to successively form a thin metal film 10 in the same vacuum chamber. More specifically, the thin film superconductor can be formed by using, as one of a plurality of evaporating sources, a metal, alloy or metal compound. After the thin metal film 10 is formed as described above, a specimen is taken out to the atmosphere to be subjected to necessary processings for a device making use of the Josephson junction using technologies such as photolithography, ion etching, chemical etching and the like, as shown in FIGS. 7b and 7c. After an inter-layer insulating film 5 is formed, this specimen is disposed again in the vacuum chamber and a barrier layer 3 is formed as an insulating layer for forming the Josephson junction on the surface of the specimen. In general, the barrier layer 3 is conveniently formed by a spattering method or EB vapor deposition method. A Josephson junction device exhibiting good superconducting characteristics can be reliably manufactured by forming the second layer-shaped oxide superconductor thin film 4 similar to the thin film 2 on the barrier layer 3 by the same method as above.

Figure 8:
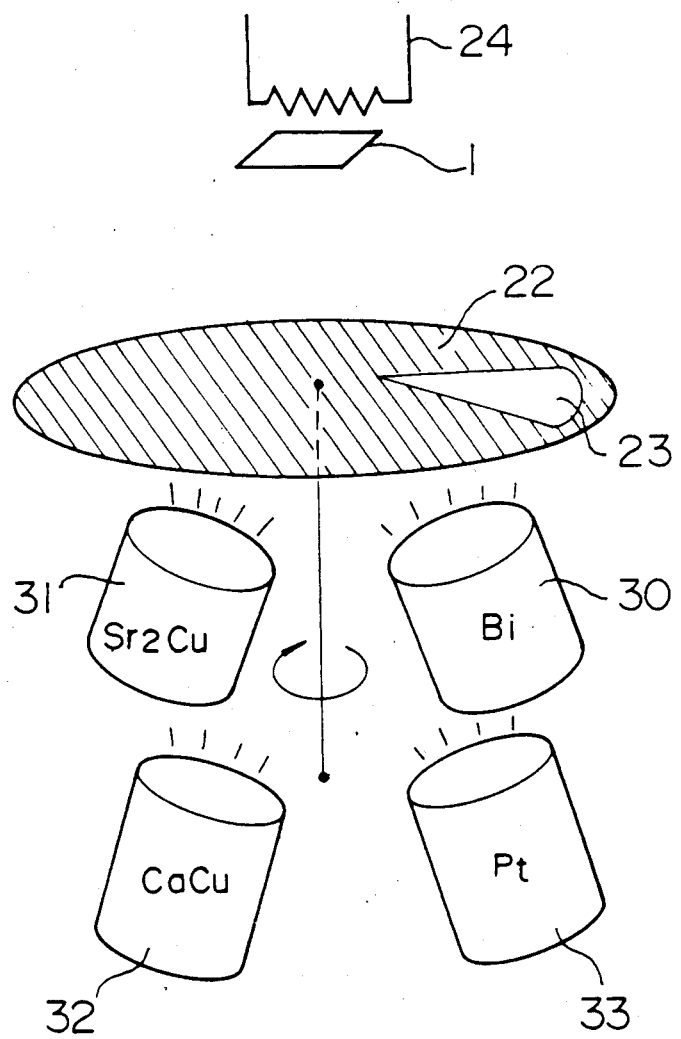
FIG. 8 is a schematic view of a thin-film-forming apparatus comprising a plurality of targets and a shutter used to manufacture a Josephson device according to the present invention.

To describe this thin film forming method in more detail, sputtering is started from Bi with a target 30 composed of Bi, as shown in FIG. 8. Numeral 31 designates a $Sr_2Cu$ target; 32 designates a CaCu target, and 33 designates a Pt target. First, an Ar gas is introduced into a vacuum chamber and discharged to start spattering. The substrate 1 is heated to 650° C. by a heater 24, oxygen is introduced and spattering conditions are set. The $Sr_2Cu$ target 31 or the CaCu target 32 is spattered to deposit Bi, Group IIa elements or Cu on a surface. In this case, the thin film is formed with its composition in conformity with the stoichiometrical ratio of the Bi type layer-shaped oxide superconductor by setting spattering conditions and moving a slit 23 defined to a shutter 22. More specifically, this is realized by regulating a rotating time of the shutter. After the first layer-shaped oxide superconductor thin film 2 is formed to a thickness of 500Å according to this method as shown in FIG. 6, the introduction of the oxygen gas is stopped and sputtering is effected only by Ar so that a thin film composed of Cu or Pt is formed to a thickness of several tens of angstrom or less on the surface of the first layer-shaped oxide superconductor thin film 2 to provide the thin metal film 10.

A fine processing is effected on this specimen to provide an electric connection to the first layer-shaped oxide superconductor thin film using a technique of photolithography or the like, and thus an electrode is formed. Thereafter, the Josephson junction is masked by a metal mask, a photoresist or the like to form the inter-layer insulating film 5. The interlayer insulating film is preferably composed of a perovskite structural type material, considering that the second layer-shaped oxide superconductor thin film 4 is formed on the surface thereof. For example, a Bi-Ti-O type compound containing Ti such as $Bi_4Ti_3O_{12}$, $Bi_2Ti_4O_{11}$ or the like is preferably formed to a thickness of 5000Å on the portion other than the Josephson junction. Thereafter, the mask is removed, the surface of the Josephson junction is exposed, the specimen is disposed in the vacuum chamber again and an insulating layer having a thickness of several tens of angstrom or less is formed thereon as the superconductive tunnel barrier layer 3 to provide a superconductive tunnel junction on the surface of the sample. Although this barrier layer 3 is conveniently formed by the above sputtering technique, any method capable of providing a homogeneous and uniform film can be used. A material of the barrier layer 3 is preferably a perovskite material such as $Bi_4Ti_3O_{12}$, $Bi_2Ti_4O_{11}$ or the like, like the case of the interlayer insulating film 5, considering that the second layer-shaped oxide superconductor thin film 4 is formed on the surface thereof. Then, the superconductive tunnel junction exhibiting stable characteristics can be formed by forming the second layer-shaped oxide superconductor thin film 4 on the surface of the barrier layer 3. This second layer-shaped oxide superconductor thin film 4 is preferably formed in the same vacuum vessel following the formation of the barrier layer 3 composed of the perovskite insulating thin film. This thin film can be formed by the same method as that used for the formation of the above first layer-shaped oxide superconductor thin film by replacing the Pt target 33 by a pevroskite material in FIG. 8.

The improvement in crystallinity of the superconductor thin film in the present invention is expected when selecting pevroskite materials such as $Bi_4Ti_3O_{12}$, $Bi_2Ti_4O_{11}$ and the like as materials of the interlayer insulating film and the barrier layer. Even if the same process is used for the formation of the thin film, the crystallinity may be deteriorated depending on the selection of a material of the insulating layer. It is observed that the diffusion of atoms occurs through the barrier layer in the composition of the Bi type layer-shaped composite oxide and Ca and the like are abnormally reduced, whereby the characteristics of the Josephson junction are deteriorated.

In addition, the formation of the second layer-shaped oxide superconductor thin film 4 in the same vaccum chamber following the formation of the barrier layer 3 can further improve the crystallinity of the second layer-shaped oxide superconductor thin film 4.

Next, an embodiment of a process for manufacturing a Josephson device using a Bi-Pb-Sr-Ca-Cu-O type layer-shaped oxide superconductor thin film will be described in detail.

There are several methods for periodically depositing a Bi-Pb type oxide, Group IIIa elements and Cu. In general, the periodically laminated layers can be formed in such an manner that a shutter is opened and closed in front of evaporating sources when an MBE apparatus or multi-source EB vapor deposition apparatus is used, or a type of gas is changed when a vapor phase epitaxy is used. An excellent laminated films also can be formed by a spattering method, wherein a high oxygen gas pressure, spattering discharge or the like in the spattering is considered to be convenient for the formation of a Bi type phase having a critical temperature of at least 100K.

Figure 9:
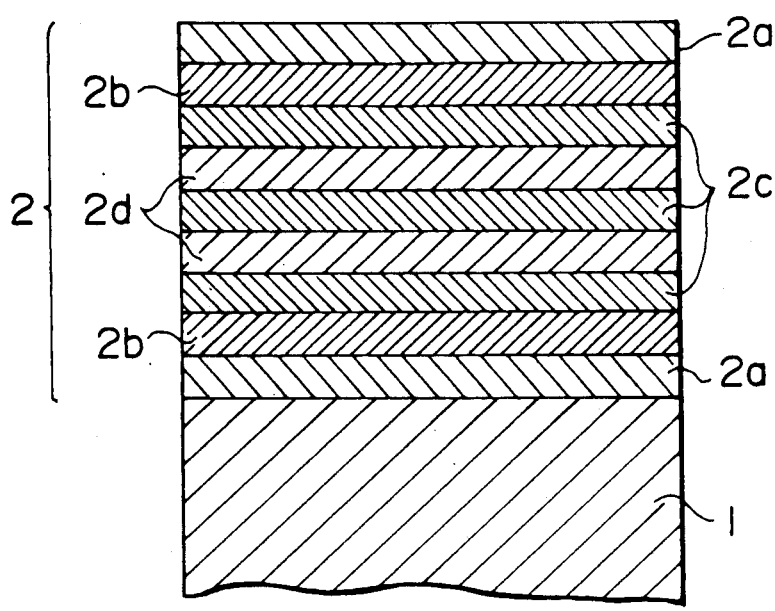
FIG. 9 is a structural cross sectional view of the first layer-shaped oxide superconductor thin film used in a Josephson device according to the present invention.
Figure 10:
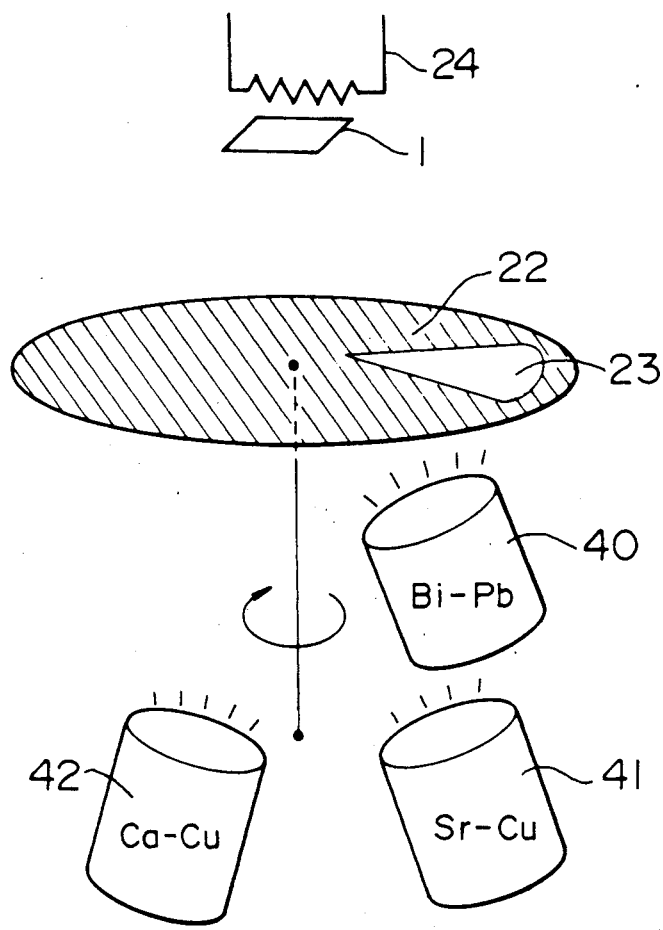
FIG. 10 is a schematic view of a thin-film-forming apparatus comprising a plurality of targets and a shutter used to manufacture a Josephson device according to the present invention.

FIG. 9 shows a structural view of a layer-shaped oxide superconductor thin film of Bi-Pb-Sr-Ca-Cu-O type. The layer-shaped oxide superconductor thin film 2 is formed on a substrate 1 by, for example, a spattering method. FIG. 10 shows a spattering apparatus used in the present invention. In FIG. 10, numeral 24 designates a heater, 40 designates a Bi-Pb alloy target, 41 designates a Sr-Cu alloy target, 42 designates a Ca-Cu alloy target. The substrate is kept at a high temperature of at least 600° C. and all the targets are discharged. At this time, an arrangement is such that an amount of atoms coming from the respective targets is reduced so that a single atomic layer can be formed in a sufficiently controllable period of time. More specifically, a discharging power is suitably controlled, wherein the discharging power of the targets can be either a direct current or a high frequency. Although only a conductive target can be spattered in a d.c. spattering method, a insulating target can be also spattered in a high frequency spattering method. As described in the above embodiment using the Bi-Sr-Ca-Cu-O type layer-shaped oxide superconductor thin film, a rotatable shutter 22 having one window 23 defined therethrough is used. Since the shutter 22 is externally controlled to perfectly control the position of the window 23 and a stopping time thereof, atomic layers can be sequentially laminated on the substrate 1. With this manner, first, the window of the shutter is moved above the Bi-Pb alloy target to enable only the atoms spattered from the Bi-Pb alloy to come onto the substrate. The spattered atoms are oxidized by oxygen in a spattering atmosphere and forms a (Bi, Pb)$_2$O$_2$ layer on the substrate. Thereafter, the shutter is sequentially moved to provide an objective lamination structure: for example, a Sr-O layer 2b, Cu-O layer 2c, Ca layer 2d, Cu-O layer 2c, Ca layer 2d, Cu-O layer 2c, Sr-O layer 2b and (Bi, Pb)$_2$O$_2$ layer are formed on a (Bi, Pb)$_2$O$_2$ layer 2a, respectively, as shown in FIG. 9. At the time, the compositional ratio of the respective layers is controlled by a period of time during which the shutter is opened and a power applied to the targets. With this manner, each thin film is formed in conformity with the stoichiometrical ratio of the Bi type layer-shaped oxide superconductor.

Although the obtained thin film exhibits a superconducting transition in the state as it is, a thin film which exhibits a transition temperature of at least 100K can be provided more securely when it is treated at 850° C. in an oxygen atmosphere for five hours.

Figure 11:
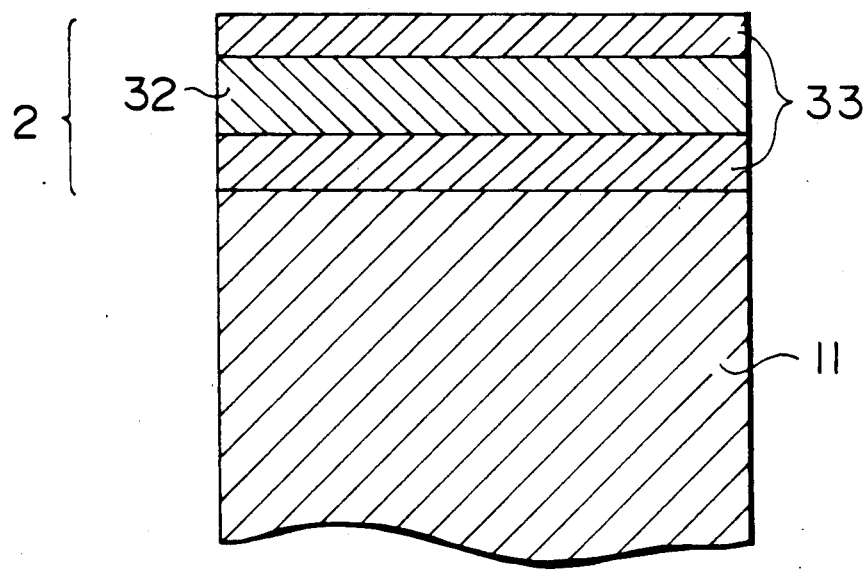
FIG. 11 is a structural cross sectional view illustrating another embodiment of the first layer-shaped oxide superconductor thin film used in a Josephson device according to the present invention.

Further, an alternative process for manufacturing a Bi-Pb-Sr-Ca-Cu-O type layer-shaped oxide superconductor thin film will be described with reference to FIG. 11. A target of Bi$_{24}$Pb$_2$O$_{40}$ is provided in addition to the three targets used in the embodiment described with reference to FIGS. 9 and 10. First, an Ar gas is introduced and then a non-superconducting thin film 33 of Bi$_{24}$Pb$_2$O$_{40}$ is formed on a substrate 1 heated to 200° C. while a shutter prevents atoms spattered by the other targets from coming thereon. Thereafter, the shutter prevents atoms spattered by the target of Bi$_{24}$Pb$_2$O$_{40}$ to form a thin film 32 of (Bi, Pb)-Sr-Ca-Cu-O type. Further, a thin film 33 of Bi$_{24}$Pb$_2$O$_{40}$ is formed on the formed thin film again. FIG. 11 shows the structure of the thin films formed as described above. They are treated at 850° C. in an oxygen atmosphere for five hours to provide a layer-shaped oxide superconductor thin film 2 exhibiting stable superconducting characteristics. The non-superconducting thin film 33 is used to prevent the evaporation of Pb when a high temperature treatment is effected, and the same effect can be expected when a Bi$_2$O$_3$ thin film is formed using a target of Bi$_2$O$_3$ in place of the target of Bi$_{24}$Pb$_2$O$_{40}$.

Although the embodiments of the present invention use the substrate 1 of the MgO (100) surface, a surface of a substrate is not limited to this surface and any other surface may be used so long as a superconductor thin film can be deposited thereon.

Although the embodiments of the present invention are described using a Bi-Sr-Ca-Cu-O or Bi-Pb-Sr-Ca-Cu-O type oxide as the first layer-shaped oxide superconductor thin film 2, the second layer-shaped oxide superconductor thin film 4 and the layer-shaped oxide superconductor thin film 6 for wiring, the same effect can be provided when using a composite compound of A-B-Cu-O type or A-B-Cu-O-S type, where A represents at least one selected from the group consisting of Sc, Y, La and lanthanoid elements having the atomic numbers of 57-71 except the atomic numbers 57, 58, 59 and 61; B represents at least one selected from the group consisting of Group IIa elements such as Ba, Sr and the like; and a concentration of each of the elements A, B and Cu, i.e., [A], [B] and [Cu] satisfy an inequality: $0.5 \leq ([A]+[B])/[Cu] \leq 2.5$.

Although the examples described above use the resist composed of two layers of negative and positive type resists, it is not limited to these resist and any resist can be used so long as it has the same function.

Also, although a thin metal film is formed between the first layer-shaped oxide superconductor thin film and a barrier layer in the above embodiments, it can be formed either between the second layer-shaped oxide superconductor thin film and the barrier layer or on both sides of the barrier layer.

Further, although a spattering method, one of physical depositing methods, is described as a method of depositing a superconductor thin film and a barrier layer in the above embodiments, other physical deposition methods such as a vacuum vapor deposition method, an electron beam vapor deposition method, an MBE method and a laser deposition method, and further chemical deposition method such as a CVD method, an MOCVD method and the like are applicable in the manufacture of the Josephson device of the present invention.

As described above, according to the present invention, a Josephson device capable of operating at a temperature higher than that of liquid nitrogen (77.3K) can be realized and applied to a superconducting quantum interference device (SQUID), a standard voltage device, a mixer, a computer and the like, and thus this invention is variable from the industrial point of view.

The present invention should not be construed to be restricted to the above embodiments and examples.

What is claimed is:

1. A Josephson device, comprising a junction formed by forming the first layer-shaped oxide superconductor thin film including a plurality of Cu-O layers on a substrate, a barrier layer thereon and the second layer-shaped oxide superconductor thin film on the barrier layer wherein a material of said barrier layer is a Bi oxide type layer-shaped compound.

2. A Josephson device according to claim 1, wherein said Bi oxide type layer-shaped compound is $Bi_2Ti_4O_{11}$ or $Bi_4Ti_3O_{12}$.

3. A Josephson device comprising a junction formed by forming the first layer-shaped oxide superconductor thin film including a plurality of Cu-O layers on a substrate, a barrier layer thereon and the second layer-shaped oxide superconductor thin film on the barrier layer, wherein an interlayer insulating film is formed above said first layer-shaped oxide superconductor thin film and surrounds said junction, and a layer-shaped oxide superconductor thin film for wiring is formed on said second layer-shaped oxide superconductor thin film of said junction, wherein a material of said barrier layer or said interlayer insulating film is a Bi oxide type layer-shaped compound.

4. A Josephson device according to claim 3, wherein said Bi oxide type layer-shaped compound is $Bi_2Ti_4O_{11}$ or $Bi_4Ti_3O_{12}$.

* * * * *